United States Patent [19]

Roy et al.

[11] Patent Number: 5,426,375
[45] Date of Patent: Jun. 20, 1995

[54] METHOD AND APPARATUS FOR OPTIMIZING HIGH SPEED PERFORMANCE AND HOT CARRIER LIFETIME IN A MOS INTEGRATED CIRCUIT

[75] Inventors: Richard S. Roy, Pleasanton; Bruce J. Barbara, Danville, both of Calif.

[73] Assignee: Hitachi Micro Systems, Inc., San Jose, Calif.

[21] Appl. No.: 23,074

[22] Filed: Feb. 26, 1993

[51] Int. Cl.$^6$ .............................................. H01L 21/00
[52] U.S. Cl. .................... 324/769; 324/768; 437/8
[58] Field of Search ............ 324/158 T, 158 D, 158 R, 324/769, 768, 764; 437/8

[56] References Cited
U.S. PATENT DOCUMENTS 5,103,166  9/1990  Jeon ........................................ 437/8
5,286,656  4/1994  Keown ............................. 324/158 T

*Primary Examiner*—Kenneth A. Wieder
*Assistant Examiner*—Mark Wardas
*Attorney, Agent, or Firm*—Flehr, Hohbach, Test, Albritton & Herbert

[57] ABSTRACT

MOS integrated circuit fabrication processes may be optimized for yield rather than for hot carrier lifetime by compensating for oversize MOS channel lengths with increased $V_{cc}$ power supply voltage, and by compensating for undersized MOS device channel lengths with decreased $V_{cc}$. Where channel lengths are greater than necessary, $V_{cc}$ is increased to increase switching times, while still operating the integrated circuit in a regime ensuring at least a minimum hot carrier lifetime. A test MOS device is fabricated on the integrated circuit substrate and in a test mode the test device substrate current $I_{bb}$ is measured. The measured $I_{bb}$ is then correlated with known $I_{bb}$ data to ascertain whether the channel length and DC hot carrier lifetime are acceptable, both for the test device and all MOS devices in the integrated circuit. The measured $I_{bb}$ value may be used with a look-up table to manually adjust the $V_{cc}$ power supply to the integrated circuit to compensate for channel length variation. The measured $I_{bb}$ value may be translated into a desired compensating value of $V_{cc}$, and the integrated circuit so labelled, electrically or by package marking. Alternatively, the measured $I_{bb}$ value may control on an-chip circuit coupled to an off-chip voltage regulator to automatically adjust $V_{cc}$ to a level ensuring at least a minimum hot carrier lifetime for the integrated circuit.

19 Claims, 4 Drawing Sheets

METHOD AND APPARATUS FOR OPTIMIZING HIGH SPEED PERFORMANCE AND HOT CARRIER LIFETIME IN A MOS INTEGRATED CIRCUIT

FIELD OF THE INVENTION

The invention relates generally to fabrication and use of metal-oxide-silicon ("MOS") integrated circuits, and more particularly to a method and apparatus for optimizing high speed performance and hot carrier lifetime in a MOS integrated circuit.

BACKGROUND OF THE INVENTION

Metal-oxide-silicon ("MOS") devices are fabricated on a substrate wherein source and drain regions are spaced-apart a distance defining an equivalent electrical channel length $L_{eff}$. A gate overlies and is separated from the channel by a gate oxide. In use, a $V_{cc}$ potential is presented to the device from drain to source, and a gate-source potential is coupled to the gate. The gate-source signal modulates the channel conductivity and, in a digital application, turns the MOS device on or off.

As process geometries shrink, electric fields present within the MOS device increase, since the distances across which potentials act is diminished. The resultant high magnitude electric fields generate hot carriers, which are electrons accelerated to relatively high velocities.

Hot carriers can become trapped in MOS oxides and can detrimentally affect MOS device performance, altering, for example, device threshold voltage levels and degrading drain-source current $I_{ds}$. Hot carrier lifetime is typically a measurement of the length of time it takes for the MOS device drain-source current $I_{ds}$ to degrade an arbitrary amount, for example 10%. From the standpoint of MOS device reliability, the hot carrier lifetime should be as long as possible. Because electric fields create hot carriers, hot carrier generation may be reduced by decreasing the $V_{cc}$ power supply magnitude and/or by lengthening the device channel length.

However, although a long channel length MOS device operating at low $V_{cc}$ might be reliable, the device would not be able to perform at higher switching speeds. The perennial need for higher speed switching characteristics dictates using the largest possible drain-source current. In modern production processes, the maximum value for device current can be limited by hot carrier lifetime, rather than by process lithography and/or manufacturing equipment. In this situation, a business decision must be made between reliability on one hand, and high speed performance on the other hand.

Thus the maximum $I_{ds}$ is chosen based upon the minimum value of hot carrier lifetime acceptable by the MOS device manufacturer for device outgoing reliability.

Unfortunately, the normal range of process variations associated with integrated circuit fabrication can yield MOS devices whose effective channel length can vary by as much as 30% to 40% from the process minimum to maximum $L_{eff}$ range. Thus in practice, prior art fabrication plants are designed to produce MOS devices whose minimum $L_{eff}$ will exceed a certain dimension yielding a device that meets a minimum hot carrier lifetime.

However, because the majority of the produced devices will not be optimized for hot carrier lifetime versus high speed performance, this mode of production yields too many MOS devices with $L_{eff}$ too large for optimum high speed performance. On the other hand, where high switching speed is of the utmost consideration, prior art practice is such that the center of the spread of the fabricated devices will have sufficiently small $L_{eff}$ for high speed switching. But unfortunately, doing so produces too many devices whose $L_{eff}$ is too small for acceptable hot carrier lifetime and yield.

What is needed is a method and apparatus for determining where, within a production range of $L_{eff}$, MOS devices have been fabricated on a particular integrated circuit. Where $L_{eff}$ is identified as exceeding that required for a desired minimum hot carrier lifetime, such method and apparatus should permit higher speed operation of the integrated circuit by compensating for excess hot carrier lifetime with increased $V_{cc}$ operating potential. In this fashion, integrated circuit production can be optimized for yield, without sacrificing loss of high speed performance in those devices produced with unnecessarily large $L_{eff}$, as contrasted with the prior art. Such method and apparatus would permit even MOS devices having unnecessarily large $L_{eff}$ to be operated in a regime permitting device performance to approach that of devices produced on an integrated circuit with an optimum minimum $L_{eff}$.

Preferably, such method and apparatus should provide a compensation mechanism whereby MOS integrated circuits fabricated with too short a channel length may nonetheless be operated in a lower voltage regime such that hot carrier lifetime exceeds at least a minimal duration. Finally, such a method and apparatus should permit an integrated circuit fabrication process to be optimized for yield rather than for critical control of $L_{eff}$ and hot carrier lifetime. The present invention discloses such a method and apparatus.

SUMMARY OF THE INVENTION

In fabricating MOS integrated circuits, it is difficult to control the effective channel length $L_{eff}$ to better than about $\pm 0.1$ $\mu$. However changes in $L_{eff}$ as small as 0.1 $\mu$ can alter hot carrier lifetime by a magnitude of ten. Measured substrate current $I_{bb}$ for a test MOS device is a good indicator of the effective channel length $L_{eff}$ of the test and other MOS devices fabricated on a substrate. The measured $I_{bb}$ value is then correlated to the device $L_{eff}$ and to a maximum value of $V_{cc}$ that will ensure at least a minimum device hot carrier lifetime. Correlation data are previously made relating $I_{bb}$ levels to different measured values of $L_{eff}$ and to maximum values of $V_{cc}$ for a particular hot carrier lifetime. The correlation data are obtained from measurements made on integrated circuits identical to those to be tested, whose MOS devices exhibit a production spread of $L_{eff}$ values. The correlation data so obtained may be stored on-chip in a look-up table, or stored off-chip.

The integrated circuit may be labelled to indicate the desired compensating $V_{cc}$ voltage, or may include on-chip devices to memorialize the desired $V_{cc}$ voltage. The integrated circuit is thereafter operated at the magnitude of $V_{cc}$ so determined. For example, if the test device $I_{bb}$ indicated that MOS devices in the integrated circuit had channel lengths longer than necessary to satisfy hot carrier lifetime requirement, $V_{cc}$ provided to the integrated circuit could be increased. This would permit all devices on the integrated circuit to operate at a high current regime without sacrificing hot carrier lifetime goals. On the other hand, if $I_{bb}$ measurements indicated the channel lengths were too short, hot carrier lifetime compensation would be provided by operating the integrated circuit at a suitably decreased magnitude $V_{cc}$.

In one aspect, the present invention provides a test MOS device on an integrated circuit substrate including other MOS devices. The test device is probed in a test mode and the test device substrate current $I_{bb}$ is measured. From data correlating $I_{bb}$ to $L_{eff}$ and hot carrier lifetime, a compensating operating value of $V_{cc}$ is determined. If desired, the integrated circuit (or its package) could then be labelled with the determined maximum value of $V_{cc}$.

In another aspect, the value of the determined $V_{cc}$ is memorialized on-chip. In one embodiment, the integrated circuit includes fuse elements that are laser programmed in a second test mode to create a binary representation of the determined maximum $V_{cc}$. The pattern of blown fuses memorializes the substrate current, and on-chip circuitry coupled to the fuse elements quantizes the level of $I_{bb}$ and thus the desired compensating operating value for $V_{cc}$.

In yet another aspect, the $I_{bb}$ test signal may be coupled to on-chip circuitry to vary a parameter that will control an off-chip voltage regulator to adjust $V_{cc}$. Once the proper DC hot carrier compensating magnitude of $V_{cc}$ is determined, the integrated circuit is thereafter operated at that $V_{cc}$ potential under normal operating conditions.

So powered, the MOS devices on the integrated circuit are operated at sufficiently high source-drain current level to provide rapid switching, while ensuring that hot carrier lifetime (and thus reliability) at least exceeds a minimum acceptable magnitude. The present invention thus permits the fabrication process to be optimized for yield rather than for hot carrier lifetime alone. A method and an apparatus are disclosed.

Other objects, features and advantages of the invention will appear from the following description in which the preferred embodiments have been set forth in detail, in conjunction with the accompanying drawings.

DETAILED DESCRIPTION OF THE PREFERRED EMBODIMENTS

Figure 1:
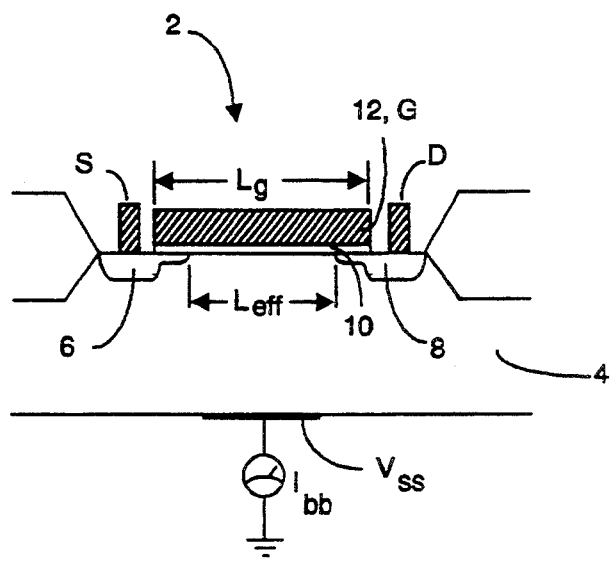
FIG. 1 depicts an NMOS device, showing measurement of substrate current $I_{bb}$, according to the present invention.

FIG. 1 depicts a generalized NMOS device 2 as comprising a substrate 4 whereon source and drain regions 6, 8 are formed, preferably with lightly doped regions at the channel edges to reduce electric fields. A thin oxide layer 10 overlies the channel region, and a gate region 12 overlies the channel region and oxide. Conductive traces are then coupled to the source, drain and gate regions, the trace contacts being depicted as S, D and G in FIG. 1. The underside of the substrate 4 is shown symbolically in FIG. 1 as having a $V_{ss}$ node from which substrate current $I_{bb}$ may be measured in a test mode.

The nominal or "drawn" length $L_g$ of gate 12 is a critical dimension that is typically 1 $\mu$ or less, depending upon the process being used to fabricate device 2. What is meant by "drawn" channel distance $L_g$ is the dimension of the actual gate electrode 12 or G. During fabrication, heat cycles associated with diffusion implants, annealing, and/or oxide growths will drive-in the source and drain regions, and will cause some lateral diffusion of the doped regions. The fabrication of such MOS devices, and integrated circuits comprising many such devices, including PMOS devices, is well known in the art and will not be described herein.

After fabrication is complete, the actual effective electrical channel distance separating the source and drain implant regions of device 2 is $L_{eff}$, a dimension typically slightly smaller than $L_g$ due to lateral diffusion of the source and drain implants.

Figure 3:
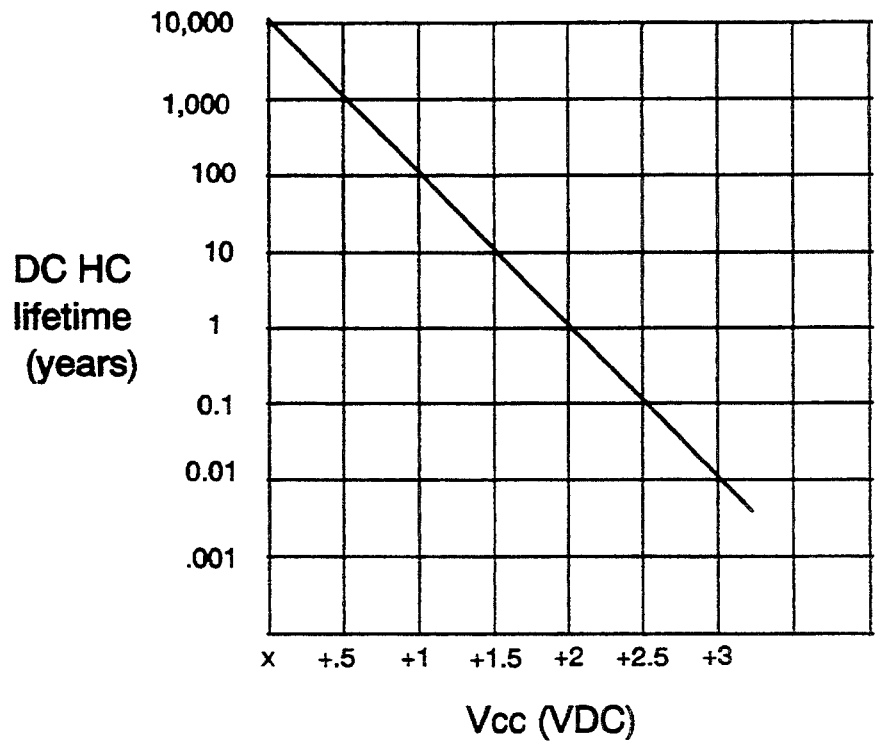
FIG. 3 depicts decreased DC hot carrier lifetime with increased $V_{cc}$ for a MOS device, at constant $L_{eff}$.

In high speed digital switching applications, it is desirable that MOS devices be operated at the highest possible current levels (e.g., high $V_{cc}$). High current capability permits rapid charging and discharging of load capacitance because as current increases, the time to charge or discharge a node decreases, e.g., $i \approx CdV/dt$. However as shown by FIG. 3, high $V_{cc}$ levels shorten hot carrier lifetime.

In practice, system and production tolerances make it difficult to control $L_g$ and thus $L_{eff}$ to better than about $\pm 0.1$ $\mu$. But as shown in FIG. 2, even a change in $L_g$ as small as 0.1 $\mu$ can change the direct current hot carrier ("DC HC") lifetime by a magnitude of ten.

As used herein, DC hot carrier lifetime refers to the measurement of hot carriers under DC bias conditions for a MOS device operated at or near a maximum $I_{bb}$. A measurement of substrate current $I_{bb}$ in a test MOS device under proper test conditions can provide a measure of DC hot carrier lifetime for the test MOS device and other devices on the same substrate. The actual value of the measured $I_{bb}$ is not critical providing it can be correlated to $L_{eff}$ for the test device. While DC hot carrier lifetime is used in the present invention as a design goal, it is understood that a DC lifetime goal of, for example, one year in most applications corresponds to an alternating current ("AC") or transient lifetime of twenty years, or more. Thus while a one year DC hot carrier lifetime goal is described herein, different lifetimes may of course be used.

Figure 2:
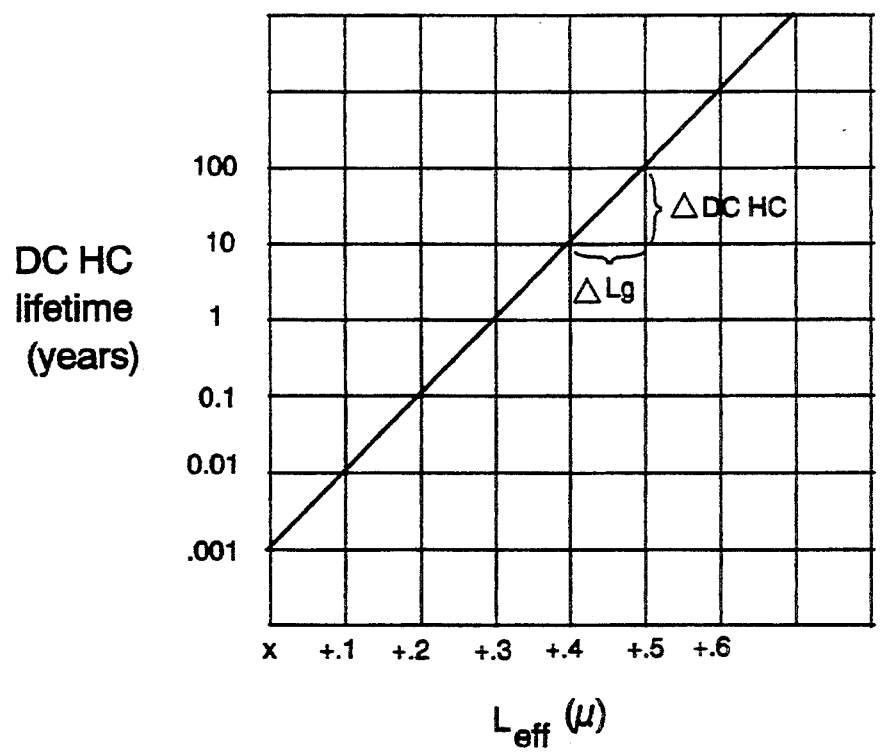
FIG. 2 demonstrates increased DC hot carrier lifetime with increased effective electrical channel length $L_{eff}$ for a MOS device, at constant $V_{cc}$.

Thus with further reference to FIG. 2, while an integrated circuit process may be designed to produce devices having $L_{eff} \leq (x+0.3)$ $\mu$, uncontrollable production variations will yield many devices with $L_{eff}$ being at least 0.1 $\mu$ or 0.2 $\mu$ larger than necessary to meet hot carrier lifetime goals. As shown by FIG. 2, an $L_{eff}$ increase of only 0.1 $\mu$ drastically increases DC hot carrier lifetime to about 10 years (corresponding to an AC lifetime of perhaps 200 years), an unnecessarily long lifetime from reliability considerations.

On the other hand, production variables could instead yield devices with $L_{eff}$ 0.1 μ or more too short, e.g., devices having a 1.2 month or so DC hot carrier lifetime. The present invention would permit identifying the devices as having undersized $L_{eff}$, and would provide compensation therefor by operating the integrated circuit with a decreased value of $V_{cc}$. The integrated circuit so operated would have acceptable hot carrier lifetime.

Figure 4:
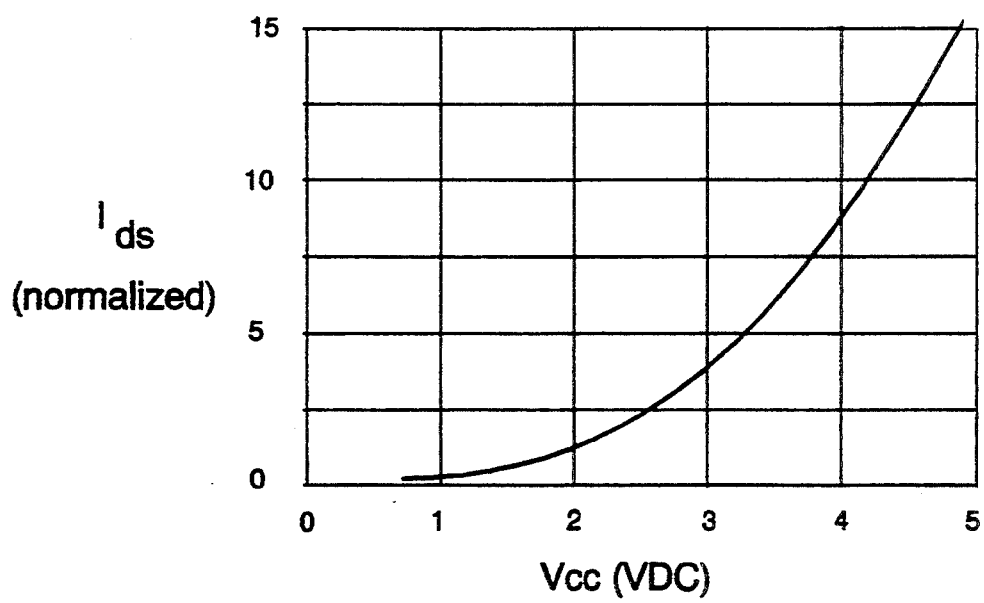
FIG. 4 depicts increase in normalized $I_{ds}$ saturation current with increasing $V_{cc}$ for a MOS device.

As shown by FIG. 3, variations in the $V_{cc}$ voltage source can also affect hot carrier lifetime. Further, as shown by FIG. 4, $V_{cc}$ also affects the maximum drain-source current in a MOS device, and therefore the switching speed of the device. It will be appreciated that an integrated circuit operating at the maximum specification for $V_{cc}$ (e.g., 3.3 VDC+10% for a standard 3.3 V logic process) must at least meet a minimum hot carrier lifetime. Operation at a reduced $V_{cc}$ level will increase hot carrier lifetime, but at the expense of high speed switching performance. Note from FIG. 3 that for a constant $L_{eff}$, a 0.5 VDC $V_{cc}$ variation changes DC hot carrier lifetime by a factor of ten. If $V_{cc}$ is nominally (x+2) VDC, a magnitude corresponding to one year DC hot carrier lifetime in FIG. 3, the ±10% tolerance normally associated with a $V_{cc}$ specification can significantly alter hot carrier lifetime. Thus an integrated circuit intended to be operated from nominal 3.3 VDC $V_{cc}$ must operate in a regime providing at least a minimum DC hot carrier lifetime (one year, for example) throughout the range $3 \leq V_{cc} \leq 3.6$ VDC.

Thus, while a value of $L_{eff}$ that is smaller than intended can degrade hot carrier lifetime, this degradation can be compensated for by decreasing $V_{cc}$. Similarly, a value of $L_{eff}$ that is unnecessarily large can be compensated for by operating the device at higher $V_{cc}$.

The present invention advantageously permits optimizing a production process for maximum yield in the center of an $L_{eff}$ specification range. By contrast, a prior art production process forced to be centered at minimum $L_{eff}$ due to speed demands suffers lower yield because undesirably short $L_{eff}$ devices are rejected as their hot carrier lifetime is too short.

Figure 5:
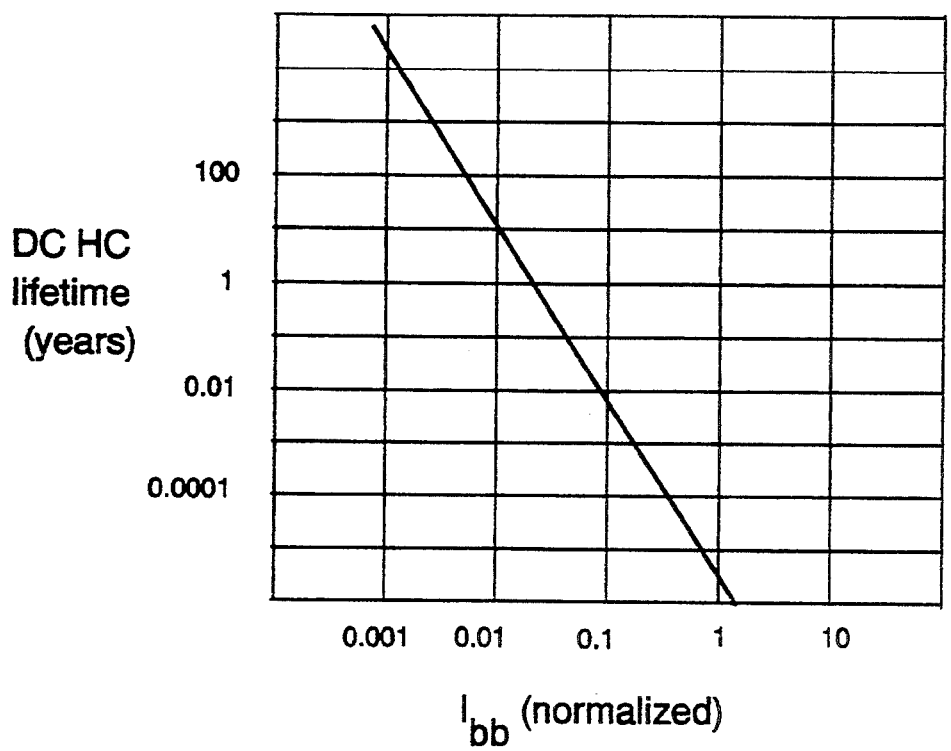
FIG. 5 depicts the relationship between substrate current $I_{bb}$ and DC hot carrier lifetime for a MOS device.

According to the present invention, for a given fabrication process correlation data are obtained by measuring a range of different $L_{eff}$s for devices in actual cross-section, and measuring $I_{bb}$ for these different devices. The devices used to provide the correlation data are obtained from replicated wafers containing integrated circuits identical those wherein hot carrier lifetime is to be ensured. The devices providing the correlation data thus will represent a production range of $L_{eff}$. $I_{bb}$ may be measured at nominal $V_{cc}$ or over a range of $V_{cc}$ values. FIG. 2 and FIG. 5 depict the generalized relationships between DC hot carrier lifetime, $L_{eff}$ and substrate current $I_{bb}$. For a given process, a range of measured $I_{bb}$ values will be associated with a range of hot carrier lifetimes.

As shown by FIGS. 2 and 5, measured values of $I_{bb}$ lower than a reference value will be associated with unnecessarily large $L_{eff}$ devices, devices having an unnecessarily large hot carrier lifetime. Similarly, measured values of $I_{bb}$ exceeding a reference value will be associated with undersized $L_{eff}$ devices having too short hot carrier lifetime. The various correlation data are stored, preferably in a look-up table 34 associated with a testing apparatus 36 (see FIG. 6), although other modes of storage may be used instead, both on-chip and off-chip.

According to the present invention, an integrated circuit including unduly large $L_{eff}$ devices is operated at a higher $V_{cc}$, thus obtaining higher current flow and higher speed performance while still exhibiting DC hot carrier lifetime within the desired range. On the other hand, integrated circuits that include devices having undersized $L_{eff}$ are operated at decreased $V_{cc}$, thus permitting the use of devices that would normally be discarded in the prior art.

Figure 6:
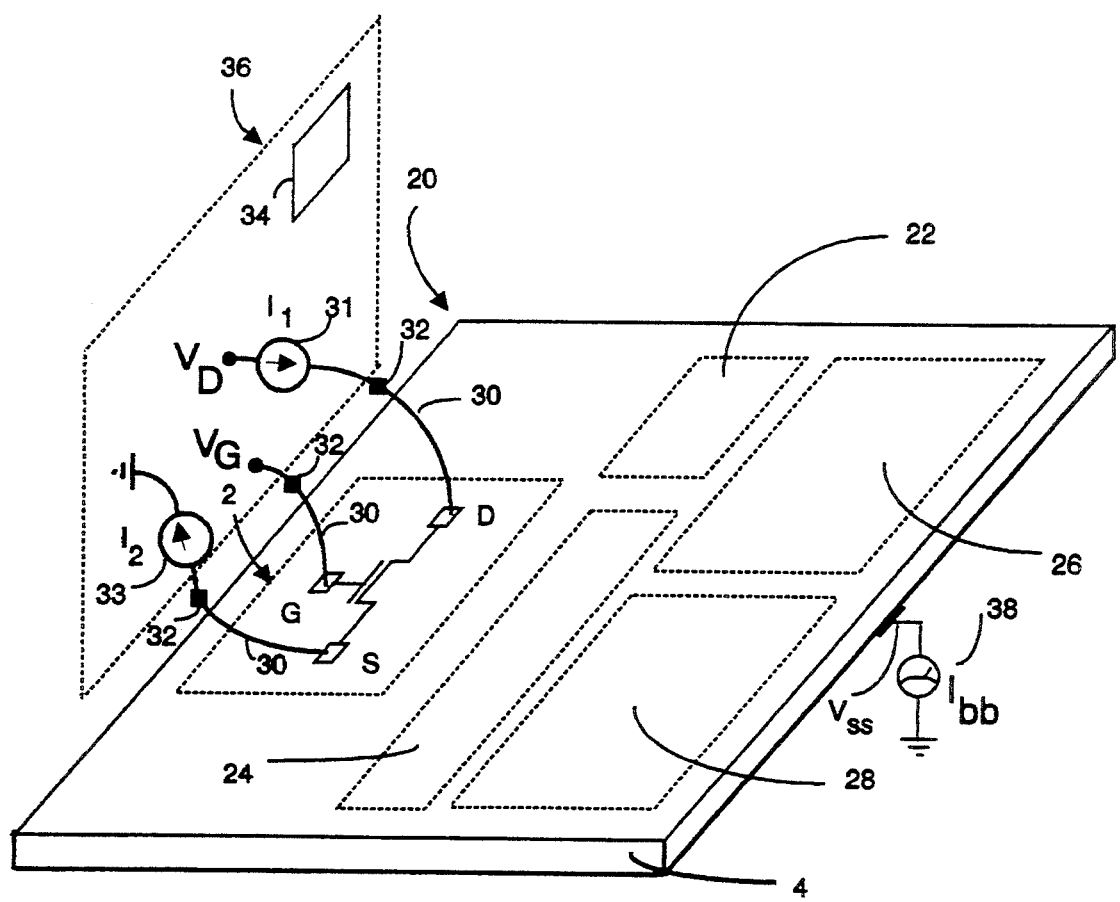
FIG. 6 depicts the inclusion of a test MOS device on a substrate to provide a measure of $I_{bb}$ for use to optimizing hot carrier lifetime.

With reference to FIG. 6, according to the present invention a test MOS device 2 is fabricated onto a substrate 4 of an integrated circuit ("IC") chip or die 20. In this example, the test device is similar to device 2 depicted in FIG. 1. In practice, most of the MOS devices on a wafer will exhibit a minimum length $L_{eff}$, and thus measurement for small $L_{eff}$ is a most important parameter. For ease of test measurements, the test device has a relatively large width ("W") relative to a minimum length ("L"). Since $I_{bb}$ increases with width W, the resultant large W/L ratio, for example 300/0.5, increases measurement sensitivity. Coupled to the source, drain and gate electrodes of device 2 are probe pads, labelled S, D and G in FIG. 6. More than one device 2 may be provided on the substrate, each device 2 having a different W/L ratio and/or channel length $L_{eff}$ to provide different $I_{bb}$ current sensitivity ranges. Preferably the resultant $I_{bb}$ will be in the mA range, facilitating the use of relatively inexpensive measuring equipment.

Of course integrated circuit chip 20 typically includes other devices and circuitry 22, 24, 26 and perhaps other components 28 as well. It is understood that some or all of the devices 2, 22, 24, 26 may be PMOS or NMOS, and that IC 20 may include a great number of MOS devices, perhaps a million or more devices if IC 20 is a processor chip. Further, while test device 2 is depicted in FIG. 6 as being near an edge of IC 20, device 2 may be fabricated elsewhere on the chip providing that probe access to pads S, G and D exists.

The advantage of providing one or more test devices 2 on the substrate is that the remaining groups of devices 22, 24, 26 typically have their sources and substrates coupled to a common $V_{ss}$ node, such that the substrate per se is not always available for test purposes. Where multiple test devices 2 are provided, their sources preferably are each coupled to separate nodes such that the $V_{ss}$ node of the semiconductor chip could be probed as the substrate of the test devices.

After chip 20 is fabricated and preferably during a wafer sort operation, probes (depicted as heavy leads 30 in FIG. 6) are coupled to the S, D and G pads of device 2. Alternatively, leads permanently bonded to these pads could be coupled to preferably otherwise unused pins (depicted as bonding pads 32) on the completed integrated circuit package. Thus in FIG. 6, leads 30 coupled to pads S, D and G may represent probes or bonding wires.

DC source and drain currents, shown respectively in FIG. 6 as $I_1$ and $I_2$, are measured by current meters 31 and 33, are then measured preferably off-chip in a test apparatus depicted in FIG. 6 generally as 36. In this test mode, the other devices on the substrate may or may not be coupled to voltage supplies. The difference between currents $I_1$ and $I_2$ approximates the substrate current $I_{bb}$ for the test device 2. In this test mode, preferably the drain test pad (D) is coupled via current meter 31 to a DC potential $V_D$ that approximates a range of $V_{cc}$ around nominal value, the source test pad (S) is coupled via current meter 33 to ground, and the gate test pad (G) is coupled to a DC potential $V_G$ that is preferably equal to 0.5 $V_D$, or slightly less. These relative test bias levels tend to maximize $I_{bb}$, facilitating its measurement. Where more than one device 2 is provided, measurements may be made for each device. For example, in FIG. 6 device 22 may be one or more additional test devices, each of which may have different W/L ratios.

Alternatively, with no voltage coupled to the remaining devices on substrate 4, $I_{bb}$ may be measured with a current meter 38 (or the equivalent) coupled to the $V_{ss}$ lead(s) of integrated circuit 20.

As shown in FIG. 5, a knowledge of relative $I_{bb}$ is useful in determining where in the IC fabrication process range for $L_{eff}$ the actual devices on the integrated circuit are produced. Next, a maximum value of $V_{cc}$ is determined that allows each integrated circuit to be operated with as much $I_{ds}$ (and $I_{bb}$) as other ICs whose devices were produced with optimum $L_{eff}$, e.g., devices whose $L_{eff}$ desirably fell at the shorter end of the fabrication spread. Devices produced with too large an $L_{eff}$ will be operated at an increased value of $V_{cc}$ that improves high speed switching while preserving acceptable hot carrier lifetime. Devices produced with $L_{eff}$ shorter than the process specification will be operated at a lower $V_{cc}$ that extends hot carrier lifetime, while preserving high speed switching performance. In each instance, IC production yield is enhanced. The determined maximum $V_{cc}$ level may be labelled on the integrated circuit, for example by so marking the completed IC package, or electrically, as described herein.

Assume, for example, test device 2 yields an $I_{bb}$ measurement that, when compared to correlated data, indicates $L_{eff}$ and thus hot carrier lifetime is longer than necessary, e.g., $I_{bb}$ is lower than a reference $I_{bb}$. Using look-up data similar to FIGS. 2, 3 and 5, the thus measured $I_{bb}$ translates to a maximum value of $V_{cc}$ at which the integrated circuit may be operated normally, without decreasing DC hot carrier lifetime below a predetermined value, one year for example. As noted, the correlation data is preferably stored in a look-up table 34 associated with an off-chip tester 36 that includes the $I_1$ and $I_2$ measuring devices and $V_G$ and $V_D$ test potentials, depicted in FIG. 6.

Thus, in the above example, the magnitude of $V_{cc}$ coupled to the completed IC 20 is increased, while IC 20 remains in an acceptable hot carrier lifetime regime. Further, the increased $V_{cc}$ will, as shown by FIG. 4, result in faster device switching times due to resultant increased drain-source current.

Figure 7:
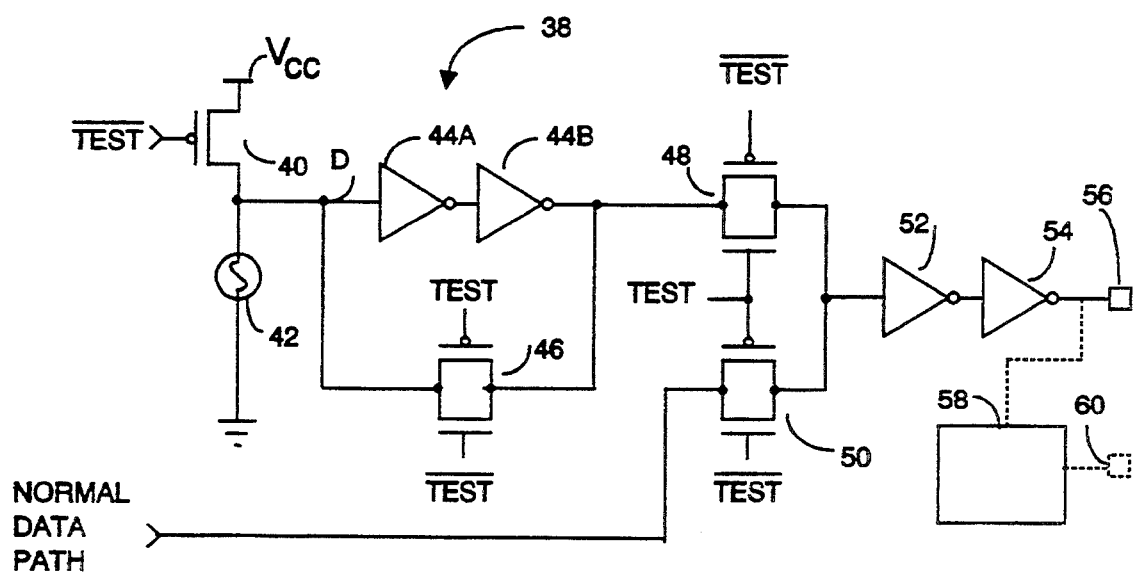
FIG. 7 depicts an on-chip fuse mechanism for memorializing and quantizing $I_{bb}$, and for providing a digital output to control an external regulator to control $V_{cc}$.

With reference to FIG. 7, in a preferred embodiment, integrated circuit 20 includes several duplicate placements of on-chip circuits 38 to memorialize and quantize the test substrate current $I_{bb}$. The plurality of circuits 38 can, for example, be element 28 depicted in FIG. 6. Circuit 38 includes a first transistor 40 whose source is coupled to $V_{cc}$ for the integrated circuit 20, and whose drain at node D is series coupled to ground via a fuse element 42.

Fuse element 42 is a laser programmable component whose impedance is very low compared to transistor 40's output impedance, and whose impedance is infinite when blown, e.g., using a laser.

In the test mode, the $\overline{TEST}$ signal will be low or "0", turning on transistors 40. If fuse element 42 has been blown, node D will be pulled to $V_{cc}$ and the output signal at pad 56 will be high or a "1". But if fuse element 42 has not been blown, node D will be low or "0", and the output signal at pad 56 will similarly be low or "0".

Different combinations of blown and unblown fuse elements 42 will correspond to different compensating levels of $V_{cc}$. For example, three circuits 38 can be used to quantize $2^3$ or eight values of $V_{cc}$. Preferably a default state of no blown fuses, e.g., a binary pattern of 0,0,0 for three circuits 38, could correspond to a nominal lower value of $V_{cc}$, whereas as pattern of 1,1,1 could correspond to a maximum value of $V_{cc}$. Fewer or more levels of $V_{cc}$ resolution could provide a coarse binning or a fine binning function for sorting the tested integrated circuits according to the range of $V_{cc}$ required for hot carrier lifetime compensation.

Thus when in a first test mode, test circuit 36 ascertains $I_{bb}$. Next, look-up table 34 (or the equivalent) is accessed to determine the maximum value of $V_{cc}$. Based upon this value of $V_{cc}$, the appropriate pattern of blown/unblown fuse elements 42 is created by the test apparatus 36 to quantize the corresponding $V_{cc}$ value.

In FIG. 7, in the non-test mode, e.g., $\overline{TEST}$ = "1" and TEST = "0", transistor 40 is turned off, and transfer gate 46 latches the value of node D, determined during a test mode. This latching prohibits node D from floating, thereby preventing DC current from flowing through inverters 44A and 44B. Further, in the non-test mode, transfer gate 48 is open, and transfer gate 50 is closed, no direct current flows though transistor 40, node D is either $V_{cc}$ or ground ($V_{ss}$), and the normal data path signal will pass through transfer gate 50, inverter 52 and driver 54 to appear at the output pad 56. In this fashion, inverter 52, buffer 54 and output pad 56 are available for normal circuit operation as well as test mode operation. Thus, the desired $V_{cc}$ memorializing data can be read from normal IC output pads (e.g., pad 56) when in the test mode, without requiring additional or dedicated pads.

The various output pad signals 56 from the plurality of circuits 38 may be coupled to circuitry 58 to be converted into a parameter useful for directly controlling $V_{cc}$. Generally, once determined, $I_{bb}$ and direct current hot carrier lifetime need not be redetermined, and once a proper magnitude of $V_{cc}$ is established to provide acceptable hot carrier lifetime, $V_{cc}$ need not be varied thereafter. Thus, while $V_{cc}$ could be dynamically controlled "on-the-fly", it is not necessary to do so.

Figure 8:
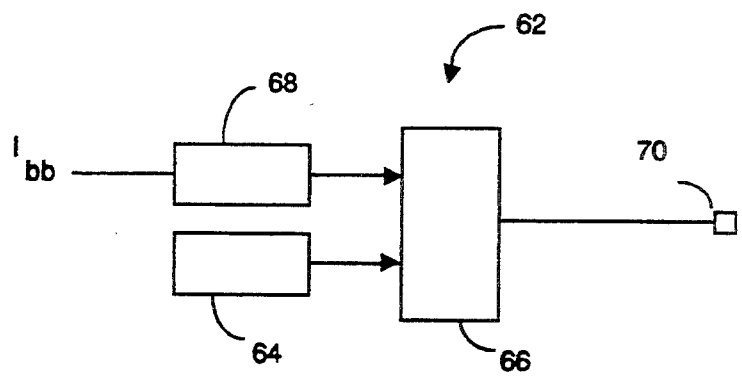
FIG. 8 depicts an on-chip mechanism for generating a $V_{cc}$ correction signal proportional to $I_{bb}$.

As shown in FIG. 8, an on-chip circuit 62 may be provided that includes a reference source 64, a comparator 66 and a current to voltage converter 68. The reference source 64, which may be a bandgap voltage generator, provides a known reference level that correlates to a reference $I_{bb}$ value. This reference level is compared by comparator 66 to a voltage provided by converter 68 corresponding to the test mode substrate current $I_{bb}$. The comparator output signal at pad 70 could then be coupled to an off-chip voltage regulator to adjust or vary $V_{cc}$ according to the difference between the reference level and the measured $I_{bb}$.

Of course the optimum maximum $V_{cc}$ value determined according to the present invention may itself be associated with a specification. This would permit a customer using the integrated circuit to know the effect upon hot carrier lifetime if the IC were operated at a slightly different $V_{cc}$ value.

Customary practice has been for IC manufacturers to produce and sell ICs rated for operation at a nominal $V_{cc}$±a tolerance. However the present invention can further enhance fabrication yield if the IC customer can provide a controlled value of $V_{cc}$ that may in fact fall outside the typical ±10% $V_{cc}$ tolerance.

Because the present invention improves the operating speed of the majority of the ICs produced, the speed of a majority of computer systems, work stations or the like using such devices is also dramatically increased. While the speed increase is realized at relatively little cost, the sale price for the computer system, work station or the like can be increased dramatically.

A further advantage to the IC manufacturer is that the overall yield can be optimized without undue concern for $L_{eff}$. The resultant high yield and high yield of relatively rapid devices provide the IC manufacturer with a competitive pricing advantage.

Modifications and variations may be made to the disclosed embodiments without departing from the subject and spirit of the invention as defined by the following claims. For example while specific methods of monitoring, quantizing and utilizing $I_{bb}$ to Control $V_{cc}$ have been described, those skilled in the art will recognize that other circuits and techniques may also be employed to achieve the goal of adjusting $V_{cc}$ to compensate for changes in $L_{eff}$ such that at least a minimum hot carrier lifetime for the integrated circuit is ensured.

What is claimed is:

1. A method of determining a maximum operating $V_{cc}$ potential for an integrated circuit fabricated on a substrate that includes metal-oxide-silicon ("MOS") devices, the determined operating $V_{cc}$ compensating for variations in effective channel lengths of the MOS devices so as to ensure at least a minimum hot carrier lifetime, the method comprising the following steps:
   (a) monitoring, in a test mode, substrate current for at least one MOS device in the integrated circuit;
   (b) comparing the substrate current monitored in step (a) with a reference substrate current based upon data correlating substrate current to effective channel length and to direct current hot carrier lifetime for a MOS device; and
   (c) determining from step (b) a compensating level of $V_{cc}$, said compensating level being greater than nominal if the monitored substrate current is less than the reference substrate current, and being less than nominal if the monitored substrate current is greater than the reference substrate current.

2. The method of claim 1, wherein said monitoring step (a) includes the additional steps of:
   (i) fabricating on said substrate a test MOS device whose source, drain and gate regions are coupled to source, drain and gate probe pads;
   (ii) coupling said source, drain and gate probe pads to first, second and third direct current potentials; and
   (iii) measuring source and drain current flow for said test MOS device and determining by the difference in said current flow the substrate current for said test device, no potential being applied to other devices on said integrated circuit during step (a).

3. The method of claim 2, wherein step (i) includes fabricating said test MOS device with a minimum channel width such that a width/length ratio for said test MOS device is sufficiently large to facilitate $I_{bb}$ measurement.

4. The method of claim 2, wherein at step (ii) said first direct current potential is ground, said second direct current potential approximates nominal $V_{cc}$, and said third direct potential does not exceed approximately 50% of said second direct current potential.

5. The method of claim 1, wherein at step (b), said data is obtained by measuring substrate current for several MOS devices having different effective channel lengths, and by actually measuring in cross-section said channel lengths for said several MOS devices, and by correlating the substrate current measured for said several MOS devices with the measured effective channel lengths.

6. The method of claim 1, wherein said monitoring step (a) is accomplished with operating potential being coupled to a test MOS device in said integrated circuit and without otherwise coupling operating potential to said integrated circuit.

7. The method of claim 1, further including at least one additional step selected from the group consisting of:
   (i) labelling the integrated circuit with the compensating level of $V_{cc}$ so determined;
   (ii) fabricating on the substrate means for memorializing the compensating level of $V_{cc}$ so determined; and
   (iii) fabricating on the substrate a circuit responsive to the monitored substrate circuit, said circuit providing as an output a parameter coupleable to an external regulator for regulating a $V_{cc}$ power supply from which the integrated circuit may be operated.

8. The method of claim 7, wherein said step (ii) includes the step of providing a plurality of fuse elements having a fuse pattern memorializing the magnitude of the substrate current.

9. A method of compensating for variations in effective channel length of metal-oxide-silicon ("MOS") devices in an integrated circuit having a substrate, to ensure at least a minimum hot carrier lifetime, the method comprising the following steps:
   (a) monitoring, in a test mode, substrate current for at least one MOS device in the integrated circuit;
   (b) comparing the substrate current monitored in step (a) with a reference substrate current based upon data correlating substrate current to effective channel length and to direct current hot carrier lifetime for a MOS device;
   (c) operating the integrated circuit at an increased magnitude $V_{cc}$ power supply level if the monitored substrate current is less than the reference substrate current, and operating the integrated circuit at a decreased magnitude $V_{cc}$ power supply level if the monitored substrate current exceeds the reference substrate current;
   wherein the magnitude of the $V_{cc}$ power supply is adjusted to compensate for variation in effective channel length of MOS devices in the integrated circuit such that at least a minimum direct current hot carrier lifetime is exceeded.

10. The method of claim 9, wherein said monitoring step (a) includes the additional steps of:
   (i) fabricating on said substrate a test MOS device whose source, drain and gate regions are coupled to source, drain and gate probe pads;
   (ii) coupling said source, drain and gate probe pads to first, second and third direct current potentials; and
   (iii) measuring source and drain current flow for said test MOS device and determining by the difference in said current flow the substrate current for said test device, no potential being applied to other devices on the integrated circuit during step (a).

11. The method of claim 10, wherein step (i) includes fabricating said test MOS device with a minimum channel width such that a width/length ratio for said test MOS device is sufficiently large to facilitate $I_{bb}$ measurement.

12. The method of claim 10, wherein at step (ii) said first direct current potential is ground, said second direct current potential approximates nominal $V_{cc}$, and said third direct potential does not exceed approximately 50% of said second direct current potential.

13. The method of claim 9, wherein at step (b), said data is obtained by measuring substrate current for several MOS devices having different effective channel lengths, and by actually measuring in cross-section said channel lengths for said several MOS devices, and by correlating the substrate current measured for said several MOS devices with the measured effective channel lengths.

14. The method of claim 9, wherein said monitoring step (a) is accomplished with operating potential being coupled to a test MOS device in said integrated circuit and without otherwise coupling operating potential to said integrated circuit.

15. The method of claim 9, wherein step (c) includes at least one additional step selected from the group consisting of:
   (i) providing said integrated circuit with a legend stating at what magnitude $V_{cc}$ the integrated circuit should be operated to meet at least a minimum direct current hot carrier lifetime;
   (ii) encoding within said integrated circuit a means for memorializing at what magnitude $V_{cc}$ the integrated circuit should be operated to meet at least a minimum direct current hot carrier lifetime;
   (iii) providing said integrated circuit with a circuit responsive to the monitored substrate current, said circuit providing as an output a parameter coupleable to an external regulator for regulating the $V_{cc}$ power supply from which the integrated circuit is operated; and
   (iv) providing a plurality of fuse elements having a fuse pattern memorializing the magnitude of the substrate current.

16. A method of determining a minimum hot carrier lifetime for an integrated circuit fabricated on a substrate that includes metal-oxide-silicon ("MOS") devices and coupleable in use to a source of operating potential $V_{cc}$, the method comprising the following steps:
   (a) monitoring, in a test mode, substrate current for at least one MOS device in the integrated circuit;
   (b) comparing the substrate current monitored in step (a) with a reference substrate current based upon data correlating substrate current to effective channel length and to direct current hot carrier lifetime for a MOS device; and
   (c) determining from step (b) a compensating level of $V_{cc}$, said compensating level being greater than nominal if the monitored substrate current is less than the reference substrate current, and being less than nominal if the monitored substrate current is greater than the reference substrate current;
   wherein said compensating level of $V_{cc}$ compensates for variations in effective channel lengths of said MOS devices so as to ensure at least a minimum hot carrier lifetime.

17. The method of claims 16, wherein said monitoring step (a) includes the additional steps of:
   (i) fabricating on said substrate a test MOS device whose source, drain and gate regions are coupled to source, drain and gate probe pads;
   (ii) coupling said source, drain and gate probe pads to first, second and third direct current potentials; and
   (iii) measuring source and drain current flow for said test MOS device and determining by the difference in said current flow the substrate current for said test device, no potential being applied to other devices on said integrated circuit during step (a).

18. The method of claim 17, wherein step (i) includes fabricating said test MOS device with a minimum channel width such that a width/length ratio for said test MOS device is sufficiently large to facilitate $I_{bb}$ measurement.

19. The method of claim 18, further including fabricating on the substrate means for memorializing compensating $V_{cc}$ level information permitting a user to cause said MOS devices to exhibit a user-selected hot carrier lifetime by operating said integrated circuit at a memorialized said $V_{cc}$ value.

* * * * *